US009214491B2

(12) United States Patent
Okita

(10) Patent No.: US 9,214,491 B2
(45) Date of Patent: Dec. 15, 2015

(54) SOLID-STATE IMAGING APPARATUS FOR CAUSING AN FD CAPACITOR VALUE TO BE VARIABLE WITHOUT INCREASING A NUMBER OF ELEMENTS

(71) Applicant: CANON KABUSHIKI KAISHA, Ohta-ku, Tokyo (JP)

(72) Inventor: Akira Okita, Yamato (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 14/516,769

(22) Filed: Oct. 17, 2014

(65) Prior Publication Data

US 2015/0035030 A1    Feb. 5, 2015

Related U.S. Application Data

(62) Division of application No. 12/687,163, filed on Jan. 14, 2010, now Pat. No. 8,913,166.

(30) Foreign Application Priority Data

Jan. 21, 2009    (JP) .................................. 2009-011344

(51) Int. Cl.
*H01L 27/146* (2006.01)
*H04N 5/343* (2011.01)
(Continued)

(52) U.S. Cl.
CPC .... *H01L 27/14643* (2013.01); *H01L 27/14609* (2013.01); *H04N 5/335* (2013.01); *H04N 5/343* (2013.01); *H04N 5/347* (2013.01); *H04N 5/37457* (2013.01)

(58) Field of Classification Search
CPC ............... H01L 27/14643; H01L 27/14609; H04N 5/374; H04N 5/3741; H04N 5/3742; H04N 5/3743; H04N 5/3745; H04N 5/37452; H04N 5/37455; H04N 5/37457; H04N 5/343; H04N 5/347; H04N 5/335; H04N 5/369; H04N 3/14; H04N 3/15
USPC .................................................. 348/294–324
See application file for complete search history.

(56) References Cited

U.S. PATENT DOCUMENTS 6,452,153 B1    9/2002    Lauxtermann et al.
6,657,665 B1    12/2003    Guidash
(Continued)

FOREIGN PATENT DOCUMENTS

| JP | 2000-165755 | 6/2000 |
|---|---|---|
| JP | 2000-232216 | 8/2000 |
| JP | 2009-033316 | 2/2009 |

*Primary Examiner* — Pritham Prabhakher
(74) *Attorney, Agent, or Firm* — Fitzpatrick, Cella, Harper & Scinto

(57) ABSTRACT

A solid-state imaging apparatus wherein an FD capacitor value is variable without increasing the number of elements. There is provided a solid-state imaging apparatus including a plurality of photoelectric conversion elements arranged in a horizontal direction and a vertical direction, for generating an electric charge by photoelectric conversion; a plurality of transfer transistors each connected to each of the photoelectric conversion elements, for transferring the electric charge generated by the plurality of photoelectric conversion elements; a plurality of floating diffusion regions for holding the electric charge transferred by the transfer transistors; a plurality of amplifiers each connected to each of the floating diffusion regions, for amplifying a signal based on the electric charge in the plurality of floating diffusion regions; and a connecting unit for connecting and disconnecting between the plurality of floating diffusion regions.

4 Claims, 18 Drawing Sheets

(51) Int. Cl.
  *H04N 5/347* (2011.01)
  *H04N 5/374* (2011.01)
  *H04N 5/335* (2011.01)
  *H04N 5/3745* (2011.01)

(56) References Cited

U.S. PATENT DOCUMENTS

| | | |
|---|---|---|
| 6,878,918 B2 | 4/2005 | Dosluoglu |
| 7,187,052 B2 | 3/2007 | Okita et al. |
| 7,283,305 B2 | 10/2007 | Okita et al. |
| 7,321,110 B2 | 1/2008 | Okita et al. |
| 7,408,210 B2 | 8/2008 | Ogura et al. |
| 7,460,162 B2 | 12/2008 | Koizumi et al. |
| 7,466,003 B2 | 12/2008 | Ueno et al. |
| 7,538,810 B2 | 5/2009 | Koizumi et al. |
| 7,550,793 B2 | 6/2009 | Itano et al. |
| 7,557,847 B2 | 7/2009 | Okita et al. |
| 7,705,900 B2 | 4/2010 | Guidash |
| 8,077,236 B2* | 12/2011 | Johnson et al. ............ 348/294 |
| 8,144,226 B2* | 3/2012 | Shah et al. ................ 348/303 |
| 8,174,595 B2* | 5/2012 | Honda et al. .............. 348/294 |
| 8,253,214 B2* | 8/2012 | Guidash et al. ............ 257/459 |
| 8,698,928 B2* | 4/2014 | Mishina et al. ............ 348/308 |
| 2001/0026321 A1* | 10/2001 | Goto ........................... 348/302 |
| 2002/0024606 A1 | 2/2002 | Yuki et al. |
| 2003/0010896 A1 | 1/2003 | Kaifu et al. |
| 2005/0088535 A1* | 4/2005 | Hatano ........................ 348/220.1 |
| 2005/0116264 A1* | 6/2005 | Watanabe .................. 257/258 |
| 2005/0195304 A1* | 9/2005 | Nitta et al. ................ 348/308 |
| 2006/0044439 A1* | 3/2006 | Hiyama et al. ............ 348/308 |
| 2006/0157759 A1 | 7/2006 | Okita et al. |
| 2006/0170804 A1 | 8/2006 | Kwon |
| 2006/0274176 A1 | 12/2006 | Guidash |
| 2008/0062290 A1* | 3/2008 | Lahav et al. ............... 348/280 |
| 2008/0136933 A1* | 6/2008 | Dosluoglu et al. ......... 348/223.1 |
| 2008/0192135 A1* | 8/2008 | Yamashita ................. 348/308 |
| 2008/0244228 A1 | 10/2008 | Overdick et al. |
| 2008/0273093 A1 | 11/2008 | Okita et al. |
| 2008/0273105 A1* | 11/2008 | Tanaka et al. ............. 348/301 |
| 2008/0291310 A1* | 11/2008 | Ladd et al. ................. 348/308 |
| 2008/0308852 A1* | 12/2008 | Lee et al. ................... 257/292 |
| 2008/0317454 A1* | 12/2008 | Onuki ......................... 396/128 |
| 2009/0021622 A1* | 1/2009 | Kume ......................... 348/302 |
| 2009/0033781 A1 | 2/2009 | Okita et al. |
| 2009/0051801 A1* | 2/2009 | Mishina et al. ............ 348/311 |
| 2009/0147117 A1 | 6/2009 | Suzuki et al. |
| 2009/0173974 A1* | 7/2009 | Shah et al. ................. 257/292 |
| 2009/0195683 A1* | 8/2009 | Honda et al. .............. 348/308 |
| 2009/0218477 A1 | 9/2009 | Okita et al. |
| 2009/0256938 A1* | 10/2009 | Bechtel et al. ............. 348/302 |
| 2009/0295965 A1* | 12/2009 | Cheung et al. ............. 348/308 |
| 2010/0007760 A1 | 1/2010 | Suzuki et al. |
| 2010/0051784 A1 | 3/2010 | Parks |
| 2010/0053396 A1 | 3/2010 | Okita et al. |
| 2010/0060764 A1* | 3/2010 | McCarten et al. ......... 348/308 |
| 2010/0118167 A1* | 5/2010 | Johnson ..................... 348/294 |
| 2011/0019051 A1* | 1/2011 | Yin et al. ................... 348/311 |

* cited by examiner

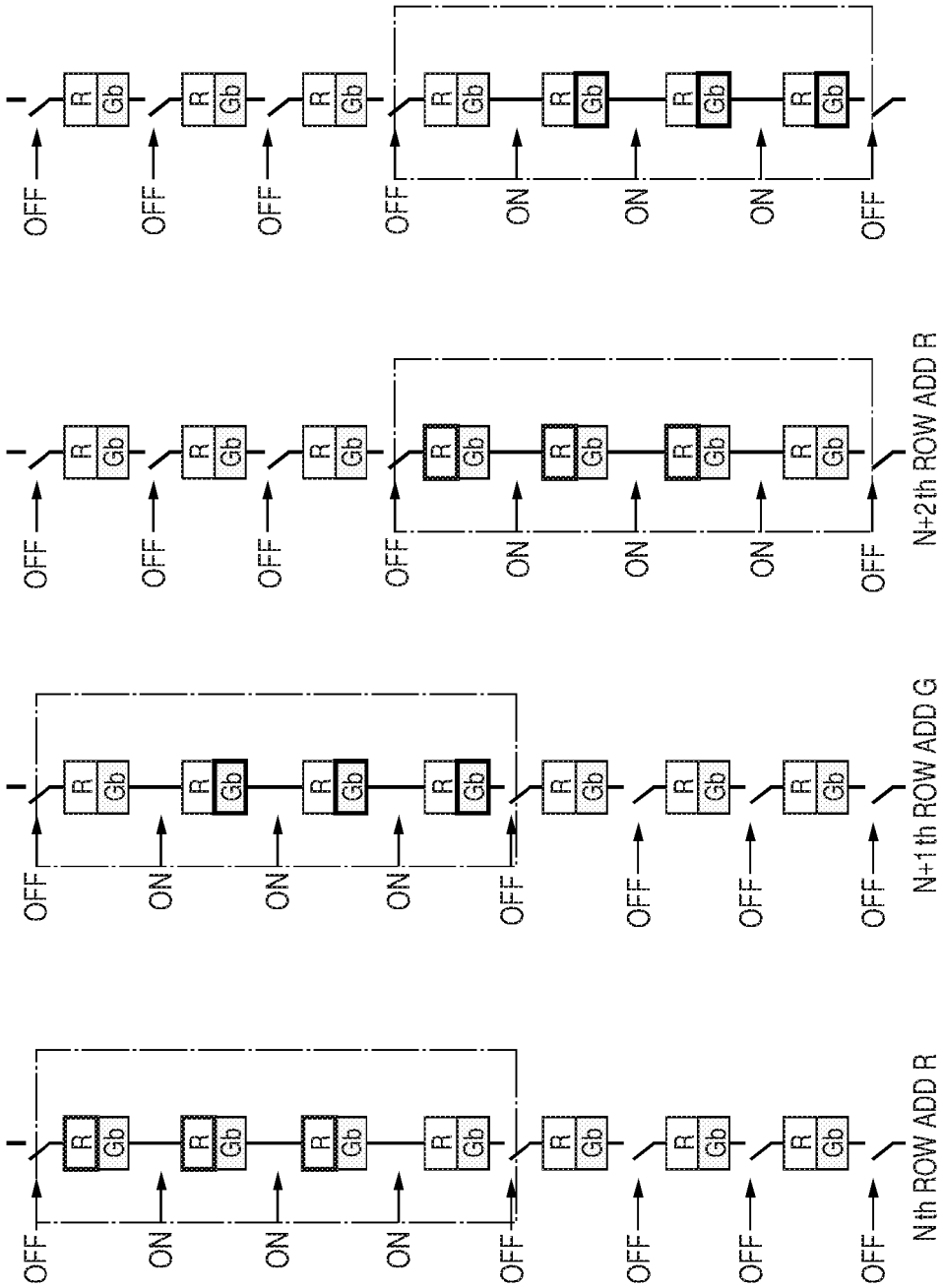

SOLID-STATE IMAGING APPARATUS FOR CAUSING AN FD CAPACITOR VALUE TO BE VARIABLE WITHOUT INCREASING A NUMBER OF ELEMENTS

This application is a divisional of application Ser. No. 12/687,163 filed Jan. 14, 2010, which in turn claims benefit of Japanese Patent Application No. 2009-011344 filed Jan. 21, 2009.

BACKGROUND OF THE INVENTION

1. Field of the Invention

The present invention relates to a solid-state imaging apparatus.

2. Description of the Related Art

As a solid-state imaging apparatus used for an electronic camera or the like, Japanese Patent Application Laid-Open No. 2000-232216 has been disclosed. The solid-state imaging apparatus has two or more sets of photodiodes (PDs) and transfer MOS transistors, performs reading out to a common floating diffusion (FD) region, and performs amplification by a common source follower MOS transistor.

Moreover, Japanese Patent Application Laid-Open No. 2000-165755 has disclosed a unit for providing a solid-state imaging apparatus in which a MOS capacitor is added to an FD so that an FD capacitor is variable, and sensitivity can be changed corresponding to signal electric charges accumulated in a photoelectric conversion section. It is possible to reduce an output signal amplitude when a large amount of electric charges are transferred to the FD, and to suppress an amplitude of a voltage on and after a vertical signal line, by increasing the FD capacitor.

However, Japanese Patent Application Laid-Open No. 2000-232216 increases the FD capacitor itself by having a common FD, and thus has a problem of a degraded SN ratio (Signal to Noise ratio).

Moreover, Japanese Patent Application Laid-Open No. 2000-165755 requires a capacitor unit for causing the FD capacitor to be electrically variable, and thus has a problem of an increased number of elements within a pixel and a reduced PD area.

An object of the present invention is to provide a solid-state imaging apparatus which can cause an FD capacitor value to be variable without increasing the number of elements.

SUMMARY OF THE INVENTION

A solid-state imaging apparatus of the present invention includes a plurality of photoelectric conversion elements for generating an electric charge by photoelectric conversion; a plurality of floating diffusion regions; a plurality of transfer transistors each connected to each of the photoelectric conversion elements, for transferring the electric charge generated by each of the photoelectric conversion elements to each of the floating diffusion regions; a plurality of amplifying units each connected to each of the floating diffusion regions, for amplifying a signal based on the electric charge in the floating diffusion regions; and a connecting unit for connecting and disconnecting between the plurality of floating diffusion regions.

Further features of the present invention will become apparent from the following description of exemplary embodiments with reference to the attached drawings.

BRIEF DESCRIPTION OF THE DRAWINGS

FIGS. 18A, 18B, 18C and 18D illustrate an example wherein, when photo carriers of adjacent pixels are added, the control data for the FD connecting transistors in each of the adjacent pixels is the same.

DESCRIPTION OF THE EMBODIMENTS (First Embodiment)

Figure 1:
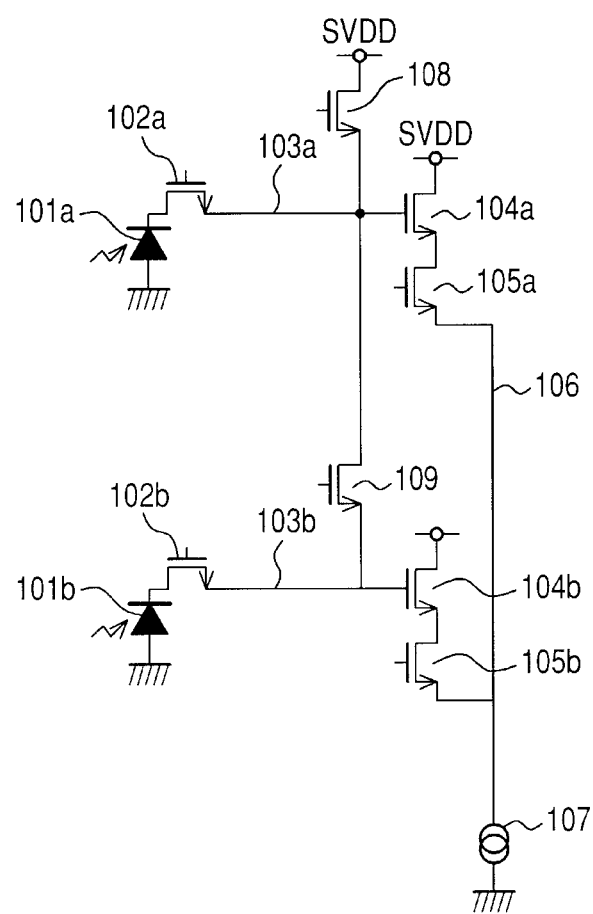
FIG. 1 illustrates a pixel circuit diagram of a solid-state imaging apparatus according to a first embodiment of the present invention.

FIG. 1 illustrates a circuit for two pixels in a solid-state imaging apparatus according to a first embodiment of the present invention. Photodiodes (PDs) 101a and 101b are photoelectric conversion elements for generating an electric charge by photoelectric conversion. Each of transfer transistors 102a and 102b transfers the electric charge generated in each of the photodiodes 101a and 101b to each of floating diffusion (FD) regions 103a and 103b. Source follower (SF) amplifiers (amplifiers) 104a and 104b output voltages which have been electric charge-voltage converted in the FD regions 103a and 103b. Selecting transistors 105a and 105b control outputs of the source follower amplifiers 104a and 104b, and are connected to a vertical signal line 106. Moreover, the vertical signal line 106 is connected to a constant current source 107.

The FD region 103a is connected to a reset transistor 108, and an FD connecting transistor (connecting unit) 109 is provided between the FD regions 103a and 103b, for setting these FD regions to be one of conducting and non-conducting. Moreover, the reset transistor 108, and the SF amplifiers 104a and 104b are connected to power supplies SVDDs of the pixels.

Figure 11:
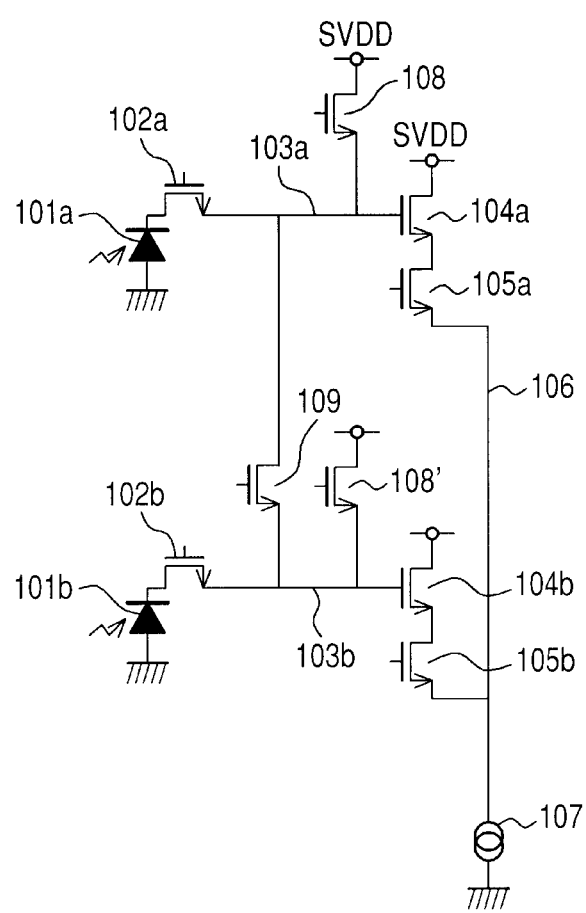
FIG. 11 shows a modification of the pixel circuit diagram shown in FIG. 1, as to a connection of the reset transistor connected to the FD region.

Moreover, while the reset transistor 108 is connected only to the FD region 103a in FIG. 1, a reset transistor 108' may be connected to the FD region 103b as illustrated in FIG. 11. On such an occasion, FD capacitors of the FD regions 103a and 103b can be more equalized, a variation in a gain of each FD region can be suppressed, and image quality can be improved.

In the circuit of FIG. 1, when a large amount of photo carriers are generated in one of the PDs 101a and 101b, the FD connecting transistor 109 is turned on to connect the FD regions 103a and 103b. Thereby, since the FD capacitor is increased, the voltage generated on the FD region can be suppressed. As a result thereof, saturation of the voltage on and after the vertical signal line 106 can be suppressed, and a dynamic range can be enlarged.

Moreover, in a state where a small amount of photo carriers are generated in one of the PDs 101a and 101b, the FD connecting transistor 109 is turned off to separate the FD region 103a from the FD region 103b. Thereby, since the FD capacitor is decreased, the voltage generated on the FD region increases, and a good SN ratio can be obtained.

Moreover, when the photo carriers in the PD 101a are read out, if the FD connecting transistor 109 has been turned on to connect the FD regions 103a and 103b, the selecting transistor 105a may be turned on to amplify by the SF amplifier 104a. Simultaneously, the selecting transistor 105b may be turned on to also use the SF amplifier 104b to perform the amplification. On this occasion, since two SF amplifiers 104a and 104b are used, a channel width W of a MOS transistor is effectively doubled. Therefore, there is an effect of reducing a 1/f noise caused by the SF amplifiers 104a and 104b, and as a result, the good SN ratio can be obtained.

Moreover, at the same time, since the channel width W of the MOS transistor is doubled, a so-called overdrive voltage can be decreased. Therefore, a larger portion of the dynamic range of the vertical signal line 106 can be used.

Moreover, when the photo carriers in the PD 101a are read out, if the FD connecting transistor 109 has been turned on to connect the FD regions 103a and 103b, either one of the selecting transistor 105a and the selecting transistor 105b may be turned on. In that case, the amplification is performed by either one of the SF amplifiers 104a and 104b. Thereby, when the 1/f noise of either one of the SF amplifiers 104a and 104b is extremely large, or when either one of the SF amplifiers 104a and 104b, or the selecting transistors 105a and 105b are defective and any normal output cannot be obtained, a normal side can be used. Thereby, there is an effect on improvement in a yielding ratio and improvement in the SN ratio.

Moreover, when it is determined which transistor is turned on, a selected row is determined in units of rows. Therefore, a test result can be previously read to select a transistor with a small noise, and a non-defective transistor can be selected.

Figure 2:
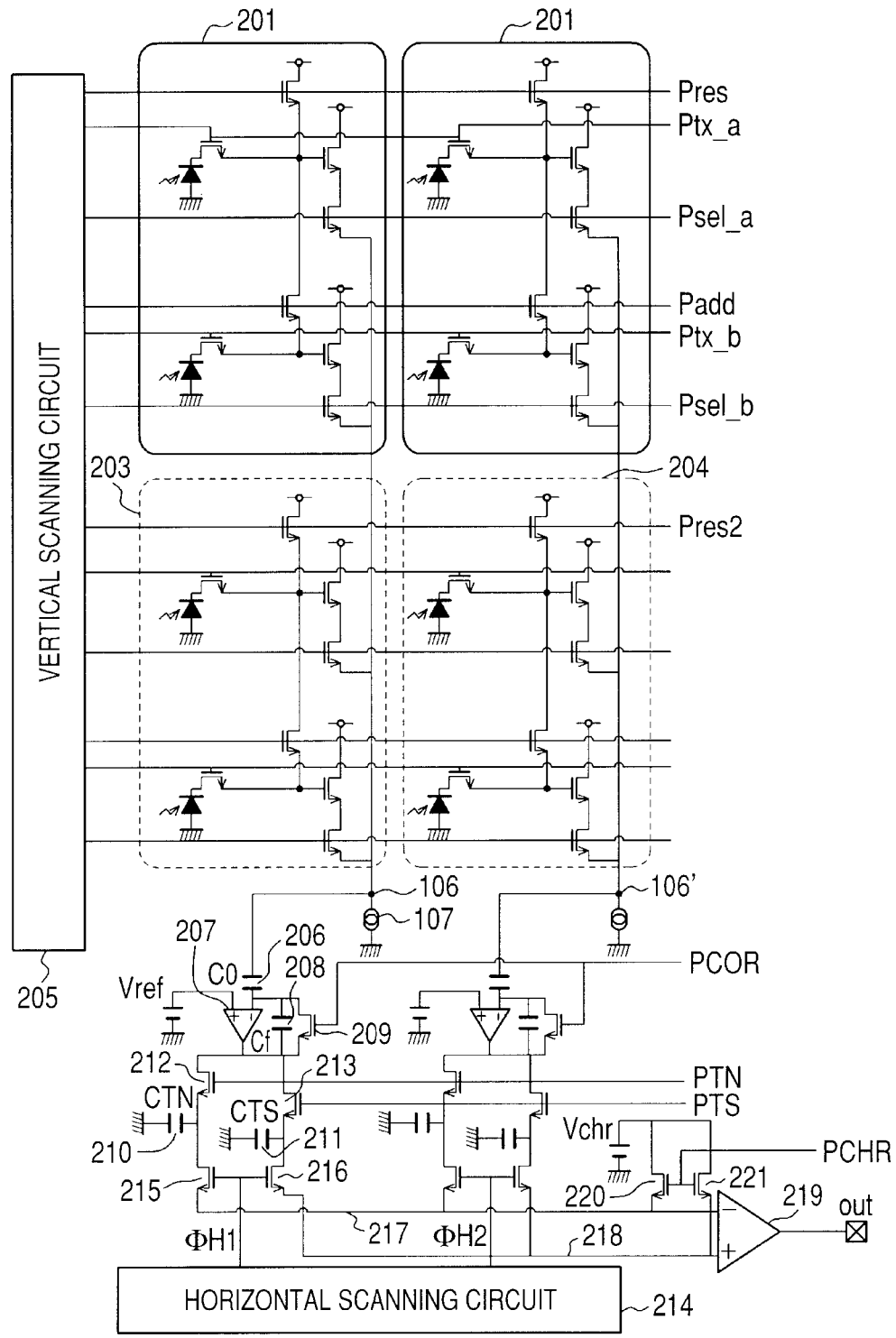
FIG. 2 illustrates a whole circuit diagram of a solid-state imaging apparatus wherein the pixel circuits in FIG. 1 are arranged in a two dimensional array.

FIG. 2 is an entire circuit diagram of the solid-state imaging apparatus constructed by arranging the pixel circuits of FIG. 1 in a two-dimensional array form. FIG. 2 illustrates an example of four rows and two columns, which, however, is not limited to this example and can accommodate a larger number of matrices of pixels.

Among pixel blocks of FIG. 1, 201 to 204, the blocks 201 and 203 are connected to the vertical signal line 106, and the blocks 202 and 204 are connected to a vertical signal line 106'.

Moreover, the blocks 201 and 202 are connected to common drive lines. In other words, a drive line Pres is connected to a gate electrode of the reset transistor 108. A drive line Ptx_a is connected to the transfer transistor 102a. A drive line Psel_a is connected to the selecting transistor 105a. A drive line Ptx_b is connected to the transfer transistor 102b. A drive line Psel_b is connected to the selecting transistor 105b. A drive line Padd is connected to the FD connecting transistor 109. Also, the blocks 203 and 204 are connected to common drive lines similarly to the blocks 201 and 202.

A vertical scanning circuit 205 sequentially selects the pixel block in a vertical direction. An operational amplifier 207 has a plus terminal connected to a reference voltage Vref, and a minus terminal connected to a clamp capacitor C0 206. Moreover, the minus terminal is connected to a feedback capacitor Cf 208 and a switch 209, and a gain of (C0/Cf) times can be applied to a signal from the pixel. Moreover, two or more of the feedback capacitors 208 may be provided, and the operational amplifier 207 may be able to change the gain by switching two or more of the feedback capacitors 208. The other terminals of the feedback capacitor 208 and the switch 209 are connected to an output terminal of the operational amplifier 207. The output terminal of the operational amplifier 207 is connected to a reference signal holding capacitor (CTN) 210 and an optical signal holding capacitor (CTS) 211, through switches 212 and 213, respectively. The switches 209, 212 and 213 are connected to drive pulses PC0R, PTN and PTS, respectively. Signals held by the capacitors 210 and 211 are output to a horizontal output line (CHN) 217 and a horizontal output line (CHS) 218 by turning on column selecting switches 215 and 216 by means of pulses which are sequentially output from a horizontal scanning circuit 214. A differential signal of these signals is taken and output by a differential output amplifier 219. Switches 220 and 221 are switches for resetting the horizontal output line (CHN) 217 and the horizontal output line (CHS) 218 to Vchr by means of a drive pulse PCHR at a desired timing.

Figure 3:
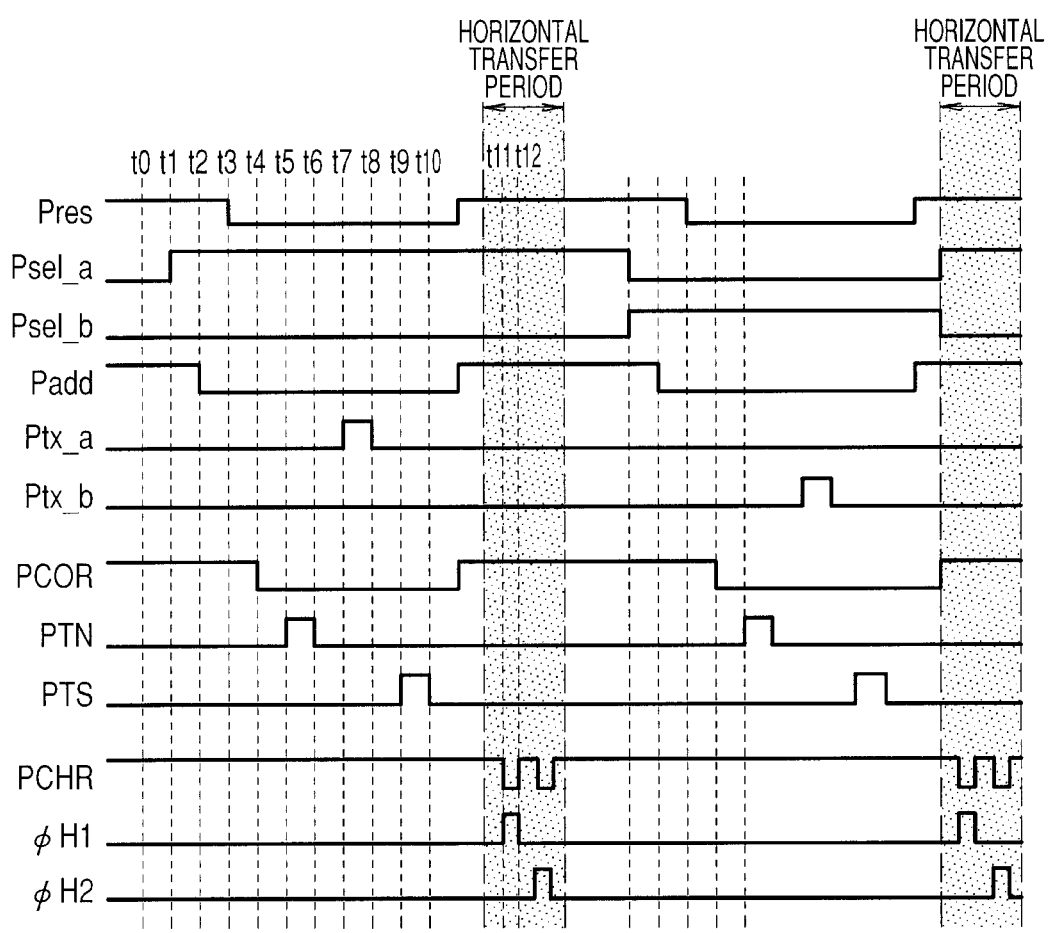
FIG. 3 shows a timing diagram of driving a circuit shown in FIG. 2 for reading out a photo carrier from a small capacity of FD according to a first embodiment of the present invention.

FIG. 3 illustrates drive timings in a case where the FD capacity is made smaller and reading out from the small capacity of FD is performed. A time when the vertical scanning circuit 205 sets the blocks 201 and 202 to an active state will be described. It should be noted that a state where the photo carriers have been already accumulated in the PDs 101a and 101b is assumed.

First, a driving method for reading out the photo carriers in a row of the PD 101a will be described. In an initial state at time T=t0, the Pres is at a high level (ON state), the Padd is also at the high level, and the FD regions 103a and 103b are reset by a voltage SVDD through the reset transistor 108 and the FD connecting transistor 109. Moreover, in a read-out circuit, the POOR is at the high level, the switch 209 is turned on, and the operational amplifier 207 buffers and outputs the voltage Vref. Moreover, the PCHR is at the high level, and the horizontal output lines 217 and 218 are fixed to the voltage Vchr.

At time T=t1, the Psel_a becomes the high level, and the SF 104a is set to the active state.

At time T=t2, the Padd becomes a low level (OFF state). At time T=t3, the Pres becomes the low level (OFF state). Then, the FD regions 103a and 103b are set to a reset state. In this state, in the vertical signal line 106, an output which has buffered the voltage that has reset the FD regions is generated.

At time T=t4, the POOR is set to the low level, and the vertical signal line 106 is clamped.

At time T=t5, the PTN is set to the high level. At time T=t6, the PTN is set to the low level. Then, the output of the operational amplifier 207 at the time of the clamp is written to the capacitor (CTN) 210.

The transfer transistor 102a is turned on and off by setting the Ptx_a to the high level at time T=t7 and setting the Ptx_a to the low level at time T=t8. Thereby, signal electric charges in the PD 101a are read out to the FD region 103a by complete transfer. Thereby, an FD electric potential is lowered, and a voltage of a signal output line also varies accordingly. This variation appears as a gain of "−(C0/Cf) times" at the output of the operational amplifier 207.

At time T=t9, the PTS is set to the high level. At time T=t10, the PTS is set to the low level. The output of the operational amplifier 207 at this time is written to the capacitor (CTS) 211.

These operations are also simultaneously performed in the adjacent block 202. The respective reset voltages and the voltages corresponding to the photo carriers generated in the respective PDs are written to the capacitor (CTN) 210 and the capacitor (CTS) 211, respectively.

At time T=t11 and t12, the signals written to the capacitor (CTN) 210 and the capacitor (CTS) 211 are output to the horizontal output lines 217 and 218 by turning on the switches 215 and 216 by means of a signal ΦpH1 from the horizontal scanning circuit 214 during a horizontal transfer period. The differential signal of the horizontal output lines 217 and 218 is output by the differential output amplifier 219. This operation is sequentially repeated, and at time T=t13 and t14, the signal in the block 202 is read out by means of a signal ΦH2. Then, a difference between an optical signal and a noise signal is output by the differential output amplifier 219.

Next, a driving method for reading out the photo carriers in a row of the PD 101b will be described. Basic operations are the same as the operations for the PD 101a, but are different in that, since the PD 101b is read out, the drive timing of the Psel_a is replaced with the Psel_b, and similarly, the drive timing of the Ptx_a is replaced with the Ptx_b.

If the FD capacitor is increased and the reading out is performed, the timing of the Padd may be fixed to the high level in FIG. 3. Thereby, both when the PD 101a is read out and when the PD 101b is read out, the FD capacitor is increased. Also, even if a large amount of signal electric charges have been transferred to the FD regions 103a and 103b, variation in the voltages of the FD regions 103a and 103b can be suppressed to small. Thus, the saturation of the voltage on and after the vertical signal line 106 can be suppressed, and the dynamic range can be enlarged.

Moreover, when the two SF amplifiers 104a and 104b are used to perform the reading out, the FD connecting transistor 109 is turned on. Then, in a state where the FD regions 103a and 103b are connected to each other, the selecting transistors 105a and 105b may be driven at a timing when a logical sum (AND) of the Psel_a and the Psel_b of FIG. 3 has been taken. Thereby, the channel width W of the MOS transistor is effectively doubled. Therefore, there is the effect of reducing the 1/f noise caused by the SF amplifiers 104a and 104b, and as a result, the good SN ratio can be obtained.

Moreover, the electric charges in the PD 101a can also be read out by the SF amplifier 104b. On such an occasion, the SF 104b may be driven at the timing of the Psel_a of FIG. 3.

Figure 13:
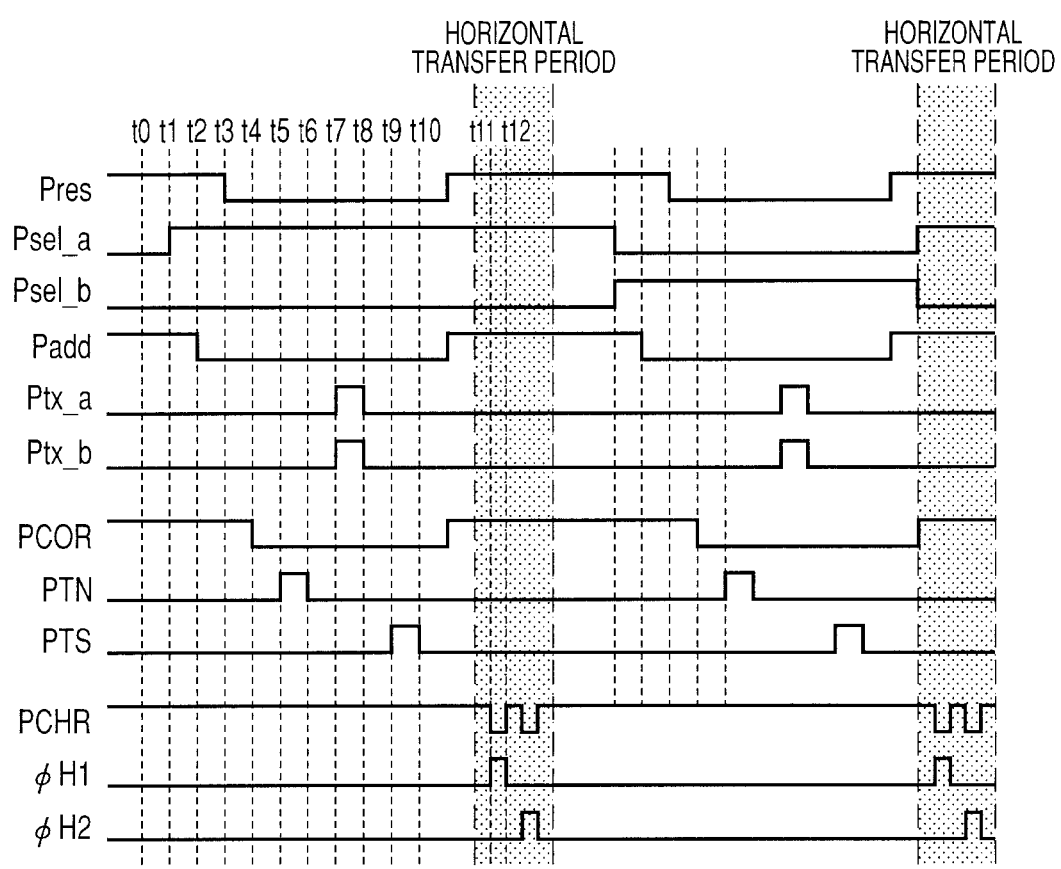
FIG. 13 shows a timing diagram of driving the circuit shown in FIG. 2 for reading out the photo carriers from a larger capacity of FD according to the first embodiment of the present invention.

Moreover, the electric charges in two PDs 101a and 101b can also be added. As driving on such an occasion, the FD connecting transistor 109 is turned on to connect the FD regions 103a and 103b to each other, and then, the transfer transistors 102a and 102b may be driven at a timing when a logical sum (AND) of the Ptx_a and the Ptx_b has been taken. The SF amplifiers 105a and 105b to be operated then may be driven as described above, and multiple or one of the SF amplifiers 105a and 105b may be selected. As specific driving on such an occasion, the FD connecting transistor 109 is turned on to connect the FDs 103a and 103b to each other, and then, the transfer transistors 102a and 102b may be driven at the timing when the logical sum (AND) of the Ptx_a and the Ptx_b has been taken, as specifically illustrated in FIG. 13.

Figure 14:
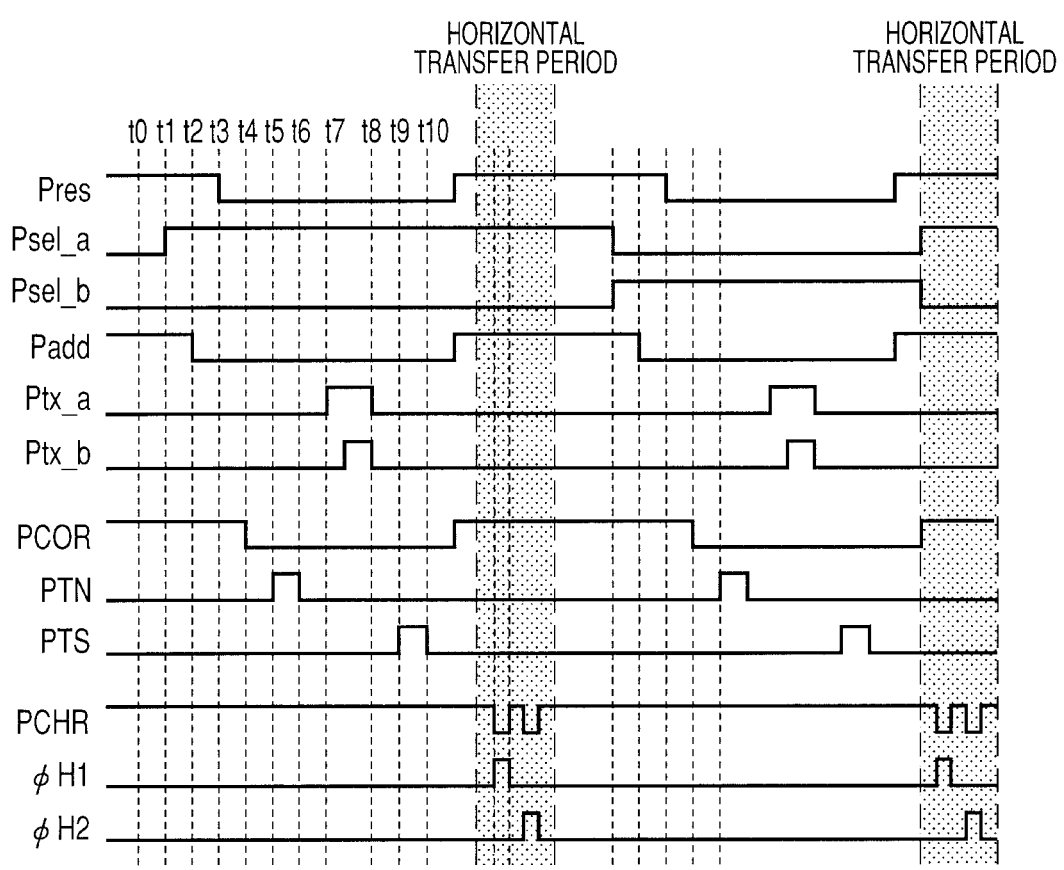
FIG. 14 shows a timing diagram of driving the circuit shown in FIG. 2 with non-simultaneous turning on the transfer transistors 102a and 102b.

Moreover, while timings when the transfer transistors 102a and 102b are turned on may not be simultaneous, timings when the transfer transistors 102a and 102b are turned off can be simultaneous. An example is illustrated in FIG. 14. The reason is that when the transfer transistor is turned on, the electric potential of the FD is raised to be a higher electric potential and the transfer becomes easier, while when the transfer transistor is turned off, the electric potential of the FD is lowered, and conversely, the transfer becomes difficult. Therefore, the reason is that when one of the transfer transistors is turned off and subsequently the other of the transfer transistors is turned off, the electric charge in the PD that is turned off later remains to be transferred, and image quality degradation such as an residual image is caused. In other words, more electric charges can be transferred by simultaneously turning off the transfer transistors when the electric charges in a plurality of the PDs are read out to a common FD.

Furthermore, since ON timings of the Ptx_a and the Ptx_b are shifted, buffer circuits which supply drive pulses for the Ptx_a and the Ptx_b are not simultaneously turned on. Therefore, a power supply voltage variation is reduced, and there is also an effect of reducing noise generation.

Moreover, the SF amplifiers 104a and 104b to be operated may be driven as described above, and multiple or one of the SF amplifiers 104a and 104b may be selected.

(Second Embodiment)

Figure 4:
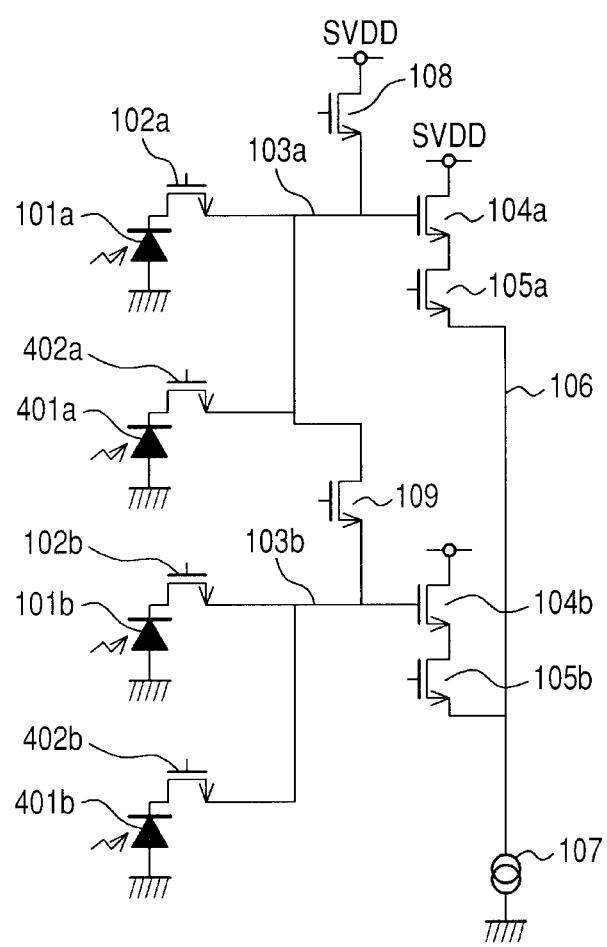
FIG. 4 illustrates a pixel circuit diagram of a solid-state imaging apparatus according to a second embodiment of the present invention.

FIG. 4 illustrates the pixel circuit in the solid-state imaging apparatus according to a second embodiment of the present invention. FIG. 4 is different from FIG. 1 in that a PD 401a is connected to the FD region 103a through a transfer transistor 402a. Similarly, a photodiode 401b is connected to the FD region 103b through a transfer transistor 402b. In other words, this structure includes two pairs of pixel structures having a common FD region and a common SF amplifier for two PDs, and the FD regions 103a and 103b are connected to each other by the FD connecting transistor 109. Read-out timings are basically the same, though the Psel, the Ptx_and the like are increased in addition to the timings illustrated in FIG. 3.

In this case, in a case of a Bayer array color filter, since the PD 101a and the PD 101b become the same color, and the PDs 401a and 401b also become the same color, addition of the same color is enabled.

Moreover, the present embodiment has shown the pixel structures having the common FD region and the common SF amplifier for two PDs, which, however, is not limited to two. The present embodiment also has a similar effect on pixel structures having the common FD region and the common SF amplifier for two or more of the PDs.

(Third Embodiment)

Figure 5A:
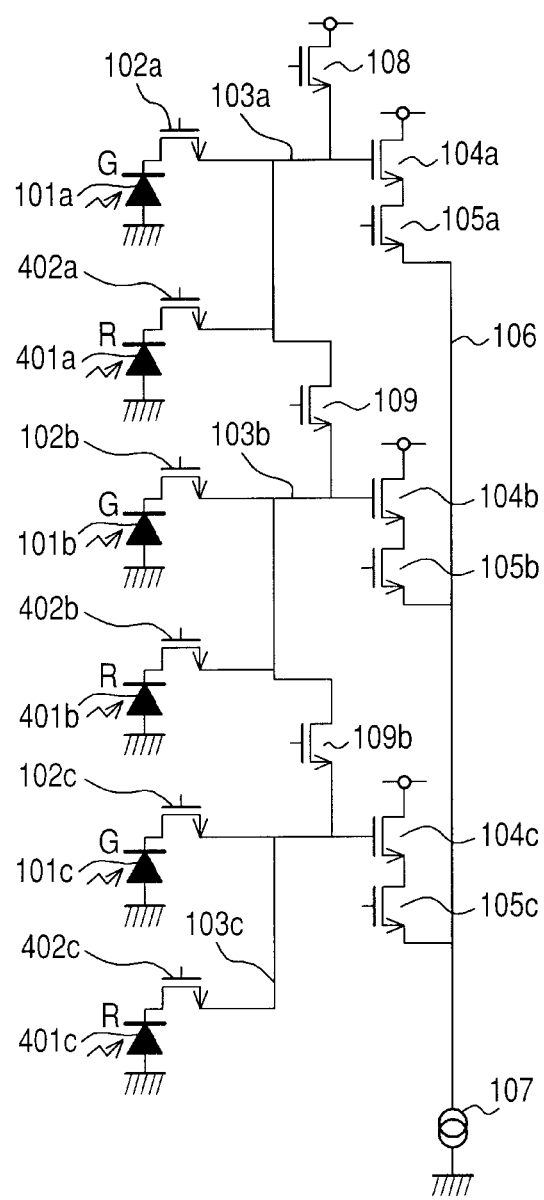
FIGS. 5A and 5B illustrate a pixel circuit diagram of a solid-state imaging apparatus according to a third embodiment of the present invention.
Figure 5B:
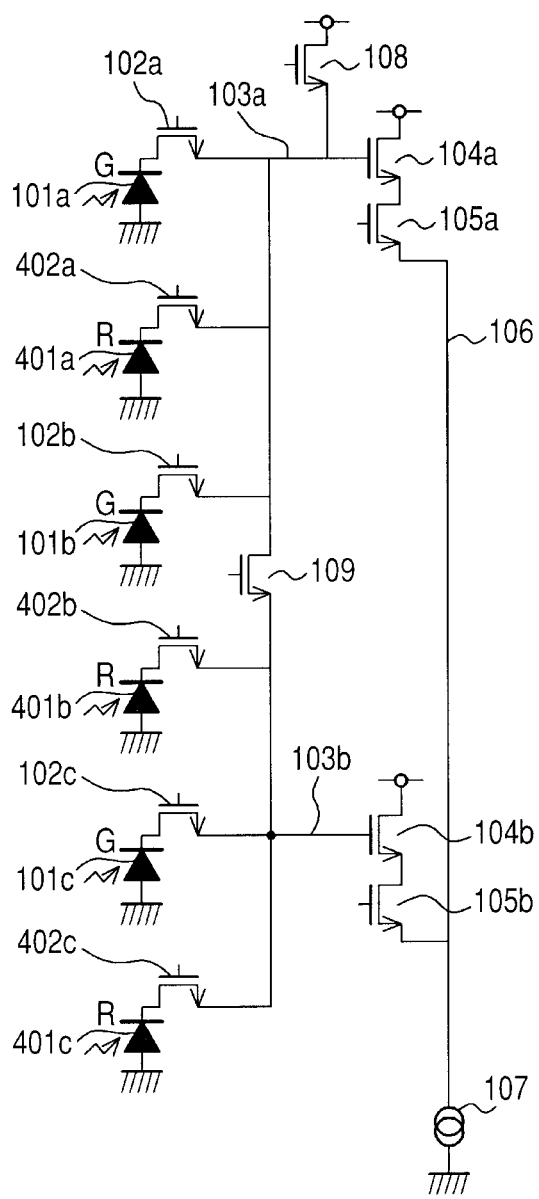

FIGS. 5A and 5B illustrate the pixel circuit in the solid-state imaging apparatus according to a third embodiment of the present invention. FIG. 5A is different from FIG. 4 in that FIG. 5A has a structure including three pairs of pixel structures having the common FD region and the common SF amplifier for two PDs, in which FD regions 103a, 103b and 103c are connected to one another by FD connecting transistors 109 and 109b. Moreover, FIG. 5B is different from FIG. 4 in that the common FD region is included for three PDs. The read-out timings are basically the same, though the Psel, the Ptx, the Padd and the like are increased in addition to the timings illustrated in FIG. 3.

In this case, in the case of the Bayer array color filter, since the PDs 101a, 101b and 101c become the same color, and the PDs 401a, 401b and 401c also become the same color, there is an effect of enabling the addition of the same color. Color centers of different colors are set at regular intervals by performing the same color addition for an odd number of pixels. Moreover, the present embodiment has shown the structure (2×3 structure) including three pairs of pixel structures having the common FD region and the common SF amplifier for two PDs, and the structure (3×2 structure) including two pairs of pixel structures having the common FD region and the common SF amplifier for three PDs, which, however, are not limited thereto. The present embodiment also has a similar effect on structures such as (2×5), (2×7), (5×2) and (7×2).

(Fourth Embodiment)

Figure 6A:
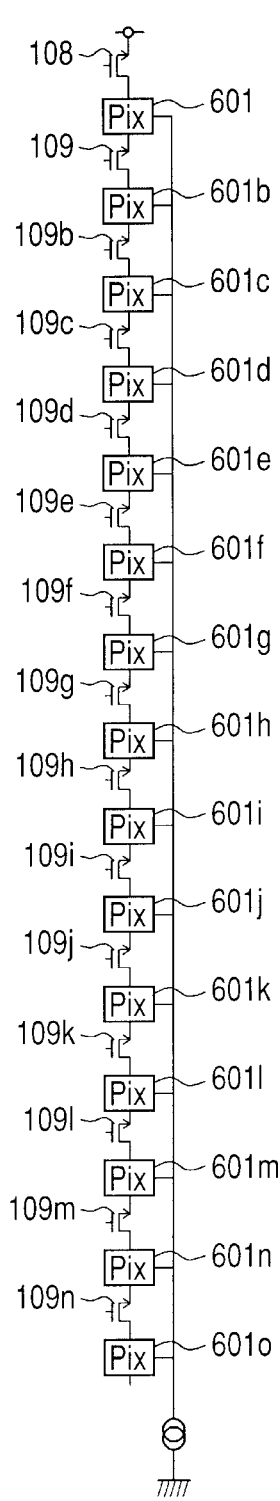
FIGS. 6A and 6B illustrate a pixel circuit diagram of a solid-state imaging apparatus according to a fourth embodiment of the present invention.
Figure 6B:
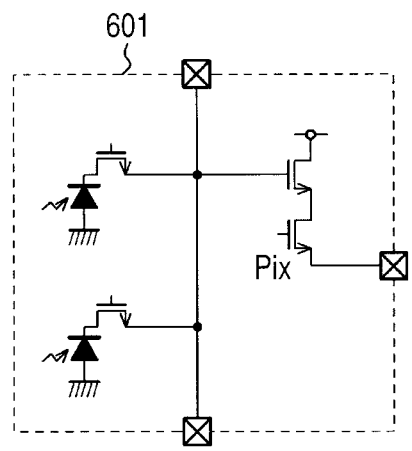

FIGS. 6A and 6B illustrate the pixel circuit in the solid-state imaging apparatus according to a fourth embodiment of the present invention. FIG. 6B illustrates the inside of a pixel block 601 of FIG. 6A. FIG. 6B illustrates a diagram of the common FD region for two pixels, which, however, may not be necessarily two pixels.

FIG. 6A has a structure in which 15 pixel blocks of FIG. 6B, 601, 601b to 601n are connected, and the respective pixel blocks are connected to one another by FD connecting transistors 109, 109b to 109n. Moreover, the pixel block 601 is connected to the voltage SVDD through the reset transistor 108.

While a basic read-out method is similar to the method shown in the second and third embodiments, the present embodiment is characterized in that the pixels to be added can be switched.

For example, if three-pixel addition is performed, the FD region is reset, and subsequently, the FD connecting transistors 109c, 109f, 109i and 109l are set to the OFF state, and the other FD connecting transistors are set to the ON state. Thereby, three-pixel addition reading out is enabled. Moreover, if five-pixel addition is performed, the FD region is reset, and subsequently, the FD connecting transistors 109e and 109i are set to the OFF state, and the other FD connecting transistors are set to the ON state. Thereby, five-pixel addition reading out is enabled.

In other words, there is an effect of enabling to change a type of the addition among a plurality of types only by changing the driving of the FD connecting transistors. While the present embodiment has shown an example of switching between the three-pixel addition and the five-pixel addition, an arbitrary combination is apparently possible.

(Fifth Embodiment)

Figure 7:
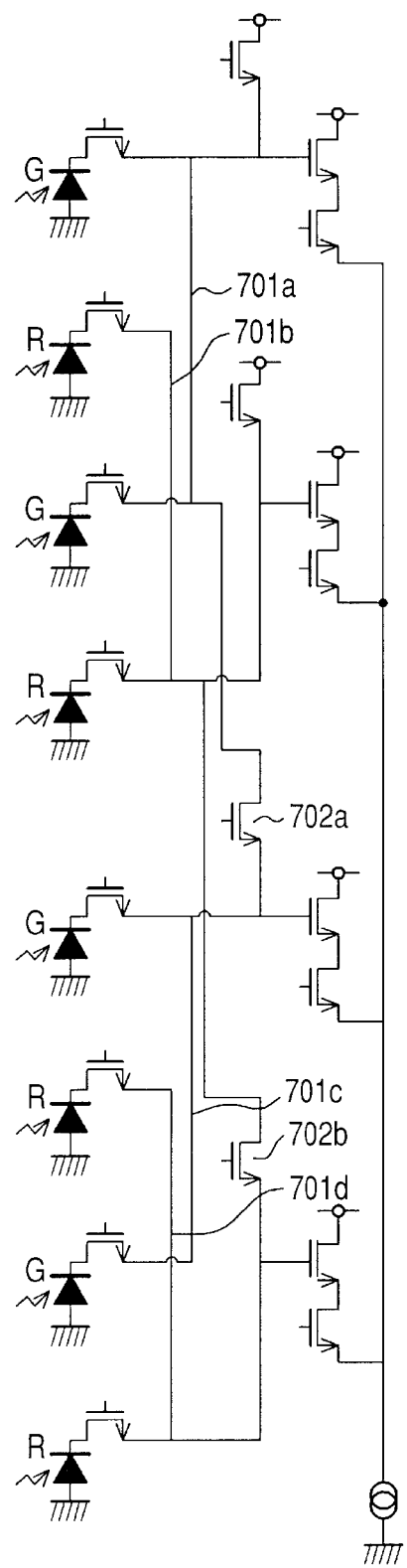
FIG. 7 illustrates a pixel circuit diagram of a solid-state imaging apparatus according to a fifth embodiment of the present invention.

FIG. 7 illustrates the pixel circuit in the solid-state imaging apparatus according to a fifth embodiment of the present invention. As a circuit diagram, the present embodiment has combined two constructions of FIG. 4 in the second embodiment. In other words, the present embodiment has a construction which has combined two structures, and in each of the two structures, two pairs of pixel structures having the common FD region and the common SF amplifier for two PDs are connected to each other by the FD connecting transistor 109. FIG. 7 is different from FIG. 4 in that two PDs having the same color are connected to the common FD region.

An FD section 701a can transfer outputs of two green (G) pixels (PDs). Moreover, an FD section 701b can transfer outputs of two red (R) pixels (PDs). The same applies to FD sections 701c and 701d. FD connecting transistors 702a and 702b are adapted to connect between the FD regions having the outputs of the same color.

In a case of pixels in a Bayer array, different colors are alternately and continuously arranged in a vertical direction. Therefore, there is an effect of enabling easy addition of three or more pixels of the same color by connecting two PDs of the same color to the common FD region, and connecting between the FD regions.

(Sixth Embodiment)

Figure 8:
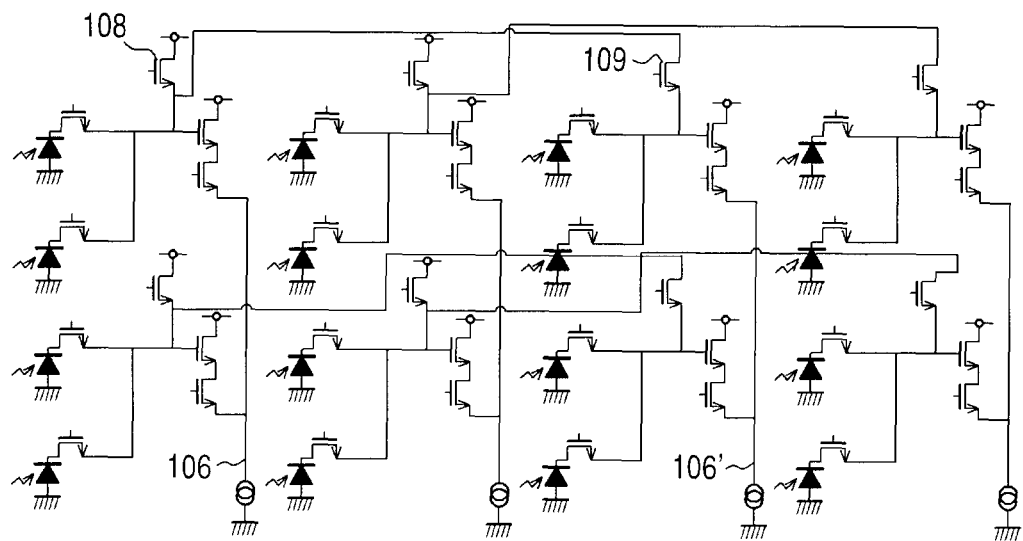
FIG. 8 illustrates a pixel circuit diagram of a solid-state imaging apparatus according to a sixth embodiment of the present invention.

FIG. 8 illustrates the pixel circuit in the solid-state imaging apparatus according to a sixth embodiment of the present invention. In the present embodiment, the FD connecting transistor 109 is provided for setting the FD regions in a horizontal direction to be one of conducting and non-conducting. Thereby, there is an effect of enabling the same color addition in the horizontal direction. As the driving method, the driving may be performed basically in the same method as the method described in the first embodiment. On such an occasion, since the same signal is generated in the vertical signal lines 106 and 106', the constant current source of the column of either one of the vertical signal lines 106 and 106' may be stopped. Thereby, there is an effect of reducing current consumption.

(Seventh Embodiment)

Figure 9:
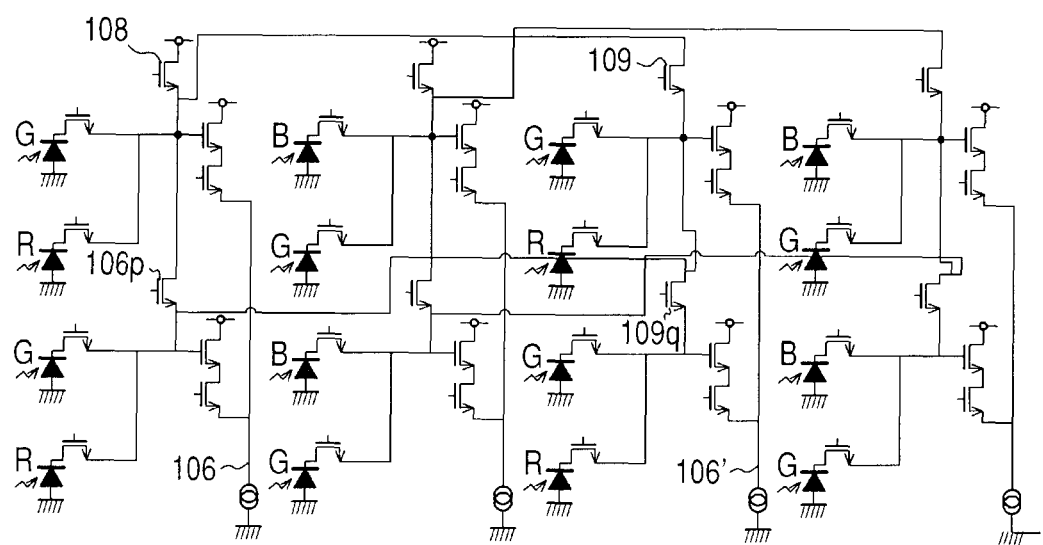
FIG. 9 illustrates a pixel circuit diagram of a solid-state imaging apparatus according to a seventh embodiment of the present invention.

FIG. 9 illustrates the pixel circuit in the solid-state imaging apparatus according to a seventh embodiment of the present invention. In the present embodiment, FD connecting transistors 109, 109p and 109q are provided for setting the FD regions in the vertical direction and the horizontal direction to be one of conducting and non-conducting. Thereby, there is an effect of enabling the same color addition in the horizontal direction and the vertical direction. While the present embodiment has shown an example of 2×2, arbitrary addition such as 3×3 is enabled.

As the driving method, the driving may be performed basically in the same method as the method described in the first embodiment. On such an occasion, since the same signal is generated in the vertical signal lines 106 and 106', the constant current source of the column of either one of the vertical signal lines 106 and 106' may be stopped. Thereby, there is the effect of reducing the current consumption.

(Eighth Embodiment)

Figure 10:
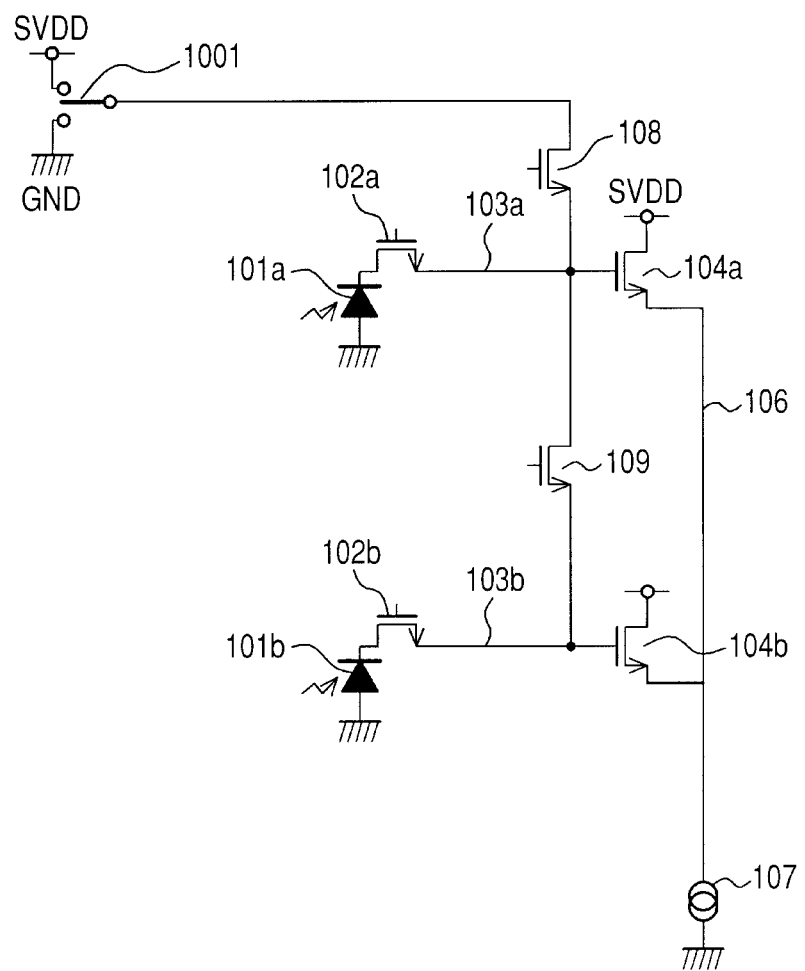
FIG. 10 illustrates a pixel circuit diagram of a solid-state imaging apparatus according to an eighth embodiment of the present invention.

FIG. 10 illustrates the pixel circuit in the solid-state imaging apparatus according to an eighth embodiment of the present invention. The present embodiment is different from FIG. 1 in that the present embodiment is constructed without the selecting transistors 105a and 105b. Instead of the selecting transistors 105a and 105b which are excluded, the present embodiment has a construction in which a switch 1001 that can switch a reset power supply between a positive electric potential SVDD and a ground electric potential GND is connected to each row.

At the row for which the reading out is not performed, the switch 1001 can set the ground electric potential GND, write the electric potential to the FD regions 103a and 103b, ground gate electric potentials of the SF amplifiers 104a and 104b, and set the SF amplifiers 104a and 104b to be inactive. Conversely, at the row for the reading out, the switch 1001 can set the positive electric potential SVDD, reset the FD regions 103a and 103b through the reset transistor 108 and the FD connecting transistor 109, and set the SF amplifiers 104a and 104b to be active.

In this way, the selecting transistors 105*a* and 105*b* of a unit pixel are eliminated, by which areas of the photodiodes 101*a* and 101*b* can be increased, or by which a pixel pitch can be reduced. Therefore, a high-image-quality solid-state imaging apparatus can be provided.

(Ninth Embodiment)

Figure 15A:
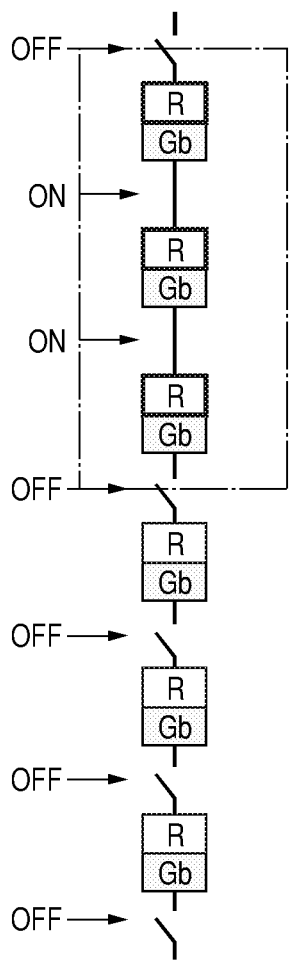
FIGS. 15A, 15B and 15C conceptually illustrate an addition operation in the solid-state imaging apparatus according to a ninth embodiment of the present invention.
Figure 15B:
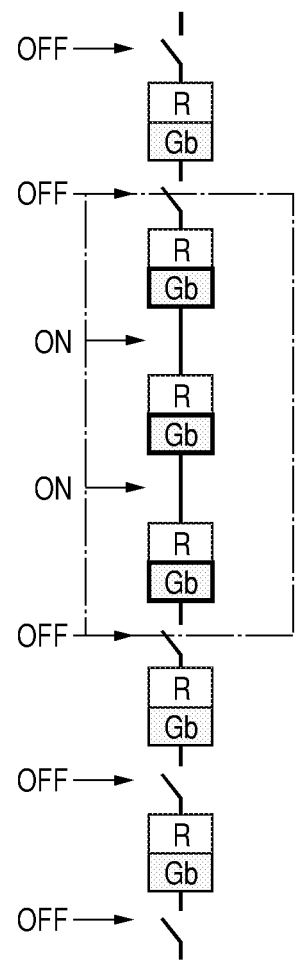
Figure 15C:
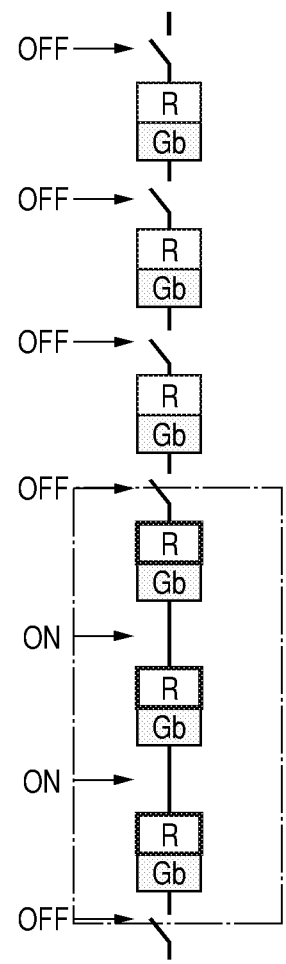

FIGS. 15A to 15C conceptually illustrate an addition operation in the solid-state imaging apparatus according to a ninth embodiment of the present invention. R and Gb denote respective photodiodes PDs. Two PDs are set as one set, and the FD connecting transistor is provided between adjacent PD sets. R and G denote red and green in the Bayer array, respectively. Here, while there are only R and G since only one predetermined column is illustrated, pixels corresponding to G and B are arranged in an adjacent column.

FIG. 15A illustrates a connecting/non-connecting state of the FD connecting transistors in a first addition operation. FIG. 15A illustrates that, in order to add R pixel signals of three pixels within a long dashed short dashed line X04, the FD connecting transistors corresponding thereto are turned on. A signal from the PD corresponding to R within the long dashed short dashed line is transferred to the FD. Moreover, a drive signal for the FD connecting transistor, which is supplied from a vertical control circuit, is represented with an arrow and ON/OFF. As the vertical control circuit, the vertical scanning circuit in the above described embodiment can be used.

Here, while a timing when the FD connecting transistor is turned on and a timing when the transfer from the PD to the FD is performed may be simultaneous or different, the transfer may be simultaneously performed from a perspective of acceleration of the transfer. Three pixels of R pixels are added by controlling the FD connecting transistors as illustrated in FIG. 15A.

FIG. 15B illustrates a second addition operation performed at an arbitrary timing after completion of FIG. 15A. Control data for the FD connecting transistors is shifted by one row so that pixel centers (sampling pitches) of R and G after the addition are identical, and the state of the FD connecting transistors is set to a state illustrated in FIG. 15B. The state is a connecting state where Gb pixels within the long dashed short dashed line can be added. Subsequently, electric charges of the Gb pixels are transferred to the FDs. Thereby, the addition in which the pixel centers are equalized can be performed while the FD capacitors are equalized.

FIG. 15C illustrates a third addition operation performed at an arbitrary timing after completion of FIGS. 15A and 15B. The R pixels to be added are three pixels existing within the long dashed short dashed line. When this operation is performed, the control data for the FD connecting transistors is shifted by two rows from FIG. 15A, or shifted by one row from FIG. 15B, thereby the connecting state is changed, and subsequently, electric charges of the R pixels are transferred.

Here, the control data for the connecting transistors may be updated according to one control period of the vertical control circuit for controlling the reading out or the transfer, that is, a so-called horizontal blanking period. For example, a shift register for controlling a connecting switch, or a memory element may be provided in the vertical control circuit, and an update timing thereof may be synchronized with the horizontal blanking period.

Hereinafter, variations of a FD connection pattern are shown.

Figure 16A:
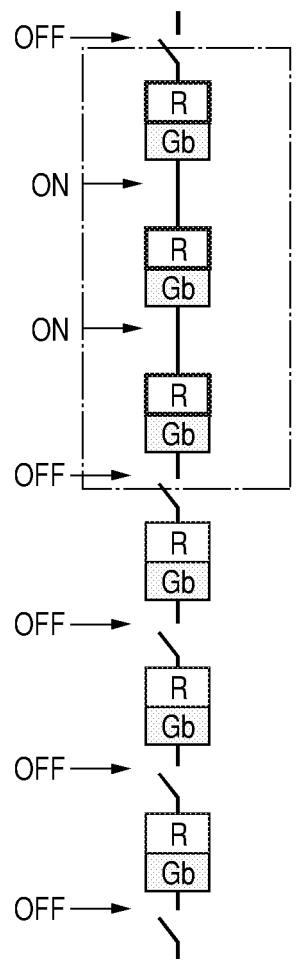
FIGS. 16A, 16B and 16C illustrate an example in which the FD connection pattern has been changed.
Figure 16B:
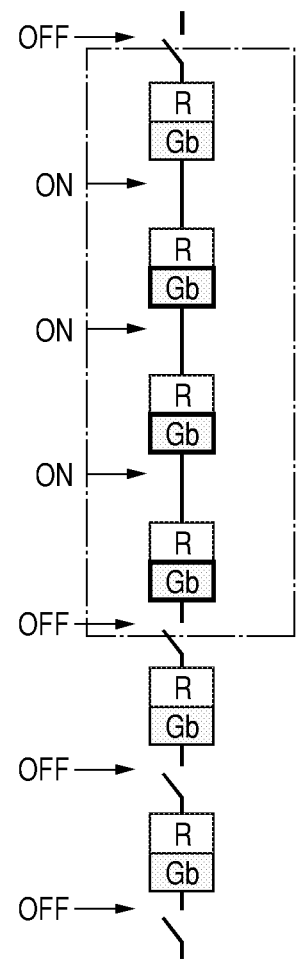
Figure 16C:
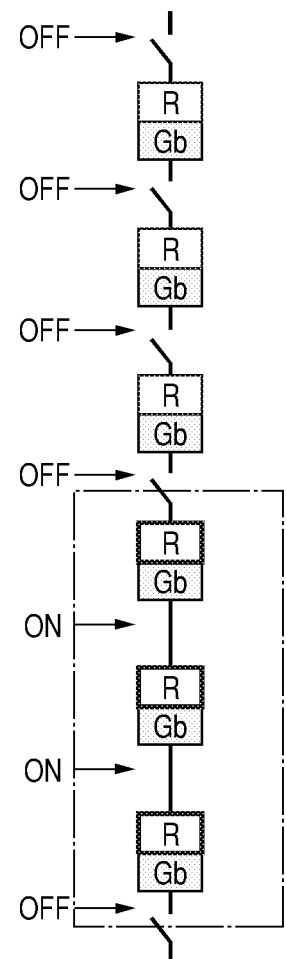

FIGS. 16A to 16C illustrate an example in which the FD connection pattern has been changed. In FIG. 16A, scan similar to FIG. 15A can be performed.

In FIG. 16B, an operation different from FIG. 15B is performed. Specifically, the Gb pixel which is not actually added is also connected by the FD connecting transistor. In other words, while three sets of FDs have been connected in FIG. 15B, four sets of FDs, which have been further increased by one, are connected in FIG. 16B. In addition, the electric charges of only the Gb pixels illustrated by thick-line boxes are transferred, and thereby the addition is performed. Control data for the FD connection is advanced by one row in a scan direction, and is not advanced on an opposite side of the scan. Thereby, the FD capacitors of only the Gb pixels with particularly high sensitivity can be increased, and green output saturation can be prevented. In FIG. 16C, an operation similar to FIG. 15C can be performed.

Figure 17A:
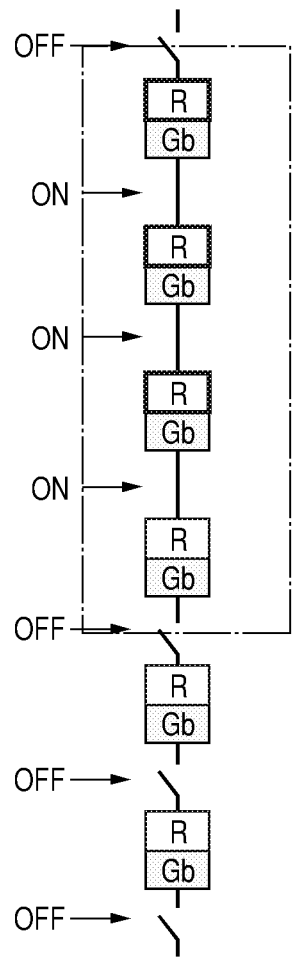
FIGS. 17A, 17B and 17C illustrate an example in which one or more FD capacitors which are not used for the addition are connected.
Figure 17B:
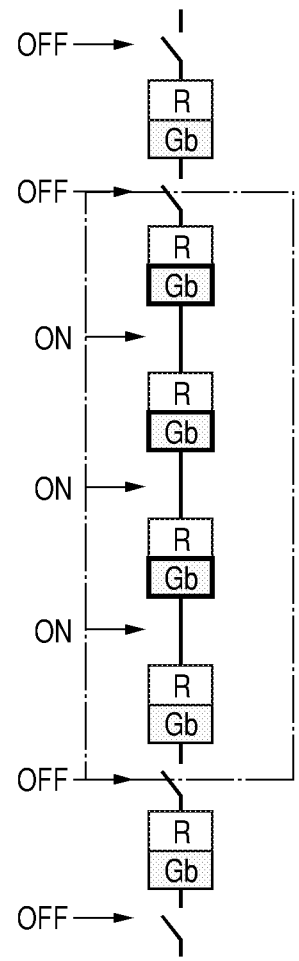
Figure 17C:
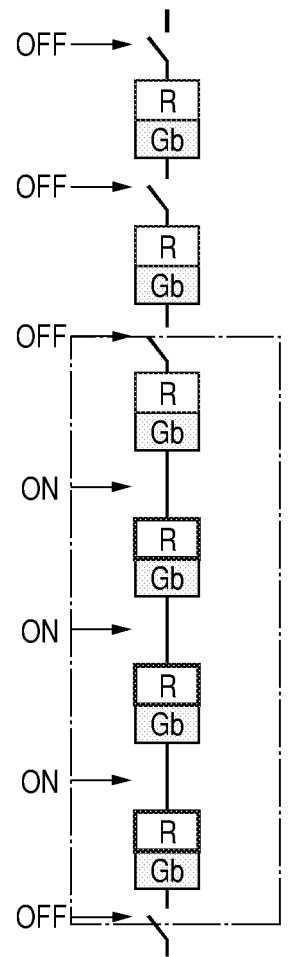

FIGS. 17A to 17C illustrate an example in which one or more FD capacitors which are not used for the addition are connected for both R and Gb. In all of FIGS. 17A to 17C, the FD connecting transistors are turned on in order to connect the FDs of the pixels illustrated within the long dashed short dashed line. For both R and Gb, the FD capacitors can be increased and output saturation can be suppressed.

In FIGS. 18A to 18D, when adjacent R and Gb are added, the control data for the FD connecting transistors in each of the adjacent R and Gb is the same. In other words, in FIGS. 18A and 18B, the addition is performed by switching the PD from which the transfer to the FD is performed, without changing the connecting state of the FD connecting transistors. The same applies to FIGS. 18C and 18D. According to such an operation, an additional effect of enabling simplification of the control data for the FD connecting transistors and the control thereof can be obtained.

(Tenth Embodiment)

In the present embodiment, an example is shown which is effective when the addition is performed by connecting two or more FDs, without connecting the FD which is not related to the addition. A color filter array is, for example, the Bayer array. The color filter array includes a construction in which one FD is provided corresponding to one PD, in other words, a construction in which the FD is not shared.

Figure 19A:
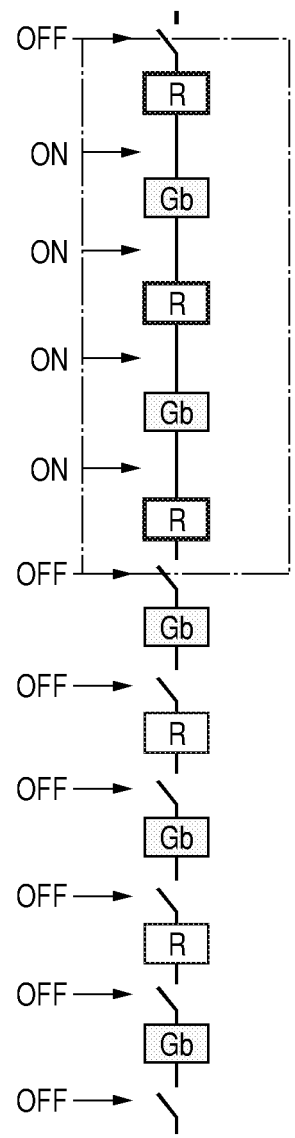
FIGS. 19A, 19B and 19C illustrate an operation when the pixel addition is performed.
Figure 19B:
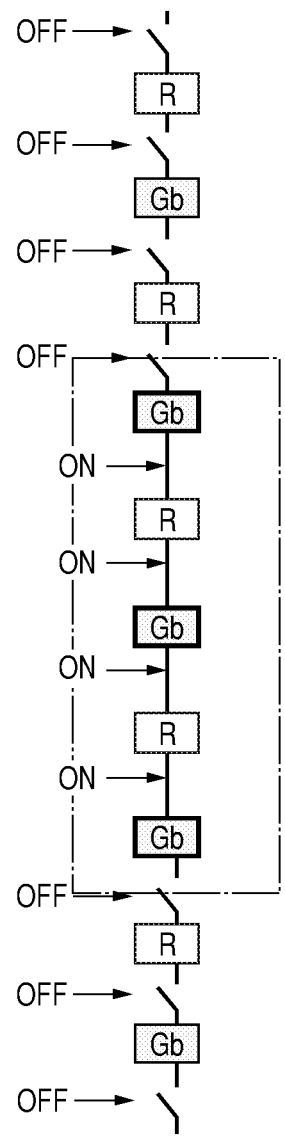
Figure 19C:
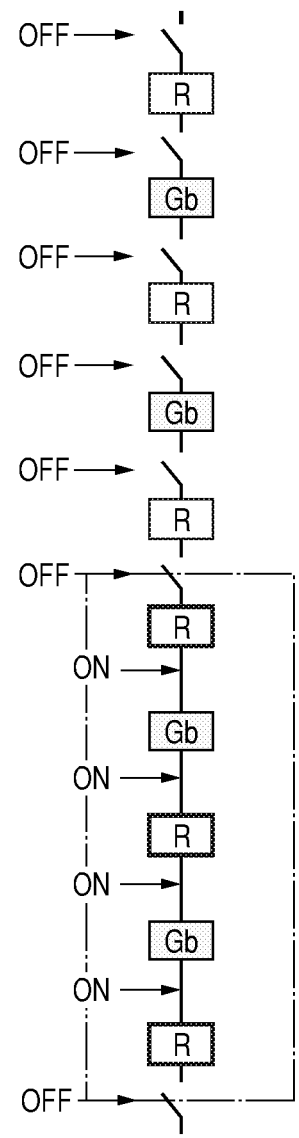

An operation when the pixel addition is performed is illustrated in FIGS. 19A to 19C. Here, the FDs corresponding to the PDs of adjacent Rs are connected to each other via the FD of Gb. Then, at a next timing, a shift by three rows is performed and a plurality of Gb pixels are added. Then the operation is performed via the Rs. The R and Gb pixels via which the operation is performed do not lose information since the electric charges are not transferred from the PDs to the FDs, and signals thereof are used for subsequent addition.

As an effect of the present example, when the same color addition is performed, lines dedicated for the addition are not required to be arranged across the different colors. As a result thereof, the number of lines arranged in the vertical direction can be decreased, a PD opening rate can be improved, and finer pixels are enabled.

Moreover, in the present example, a circuit in which the FD is not shared has been described as a unit. However, even if the FD is shared, the above described effect obtained by performing the operation via the FD which is not used can be similarly obtained.

(Eleventh Embodiment)

Figure 12:
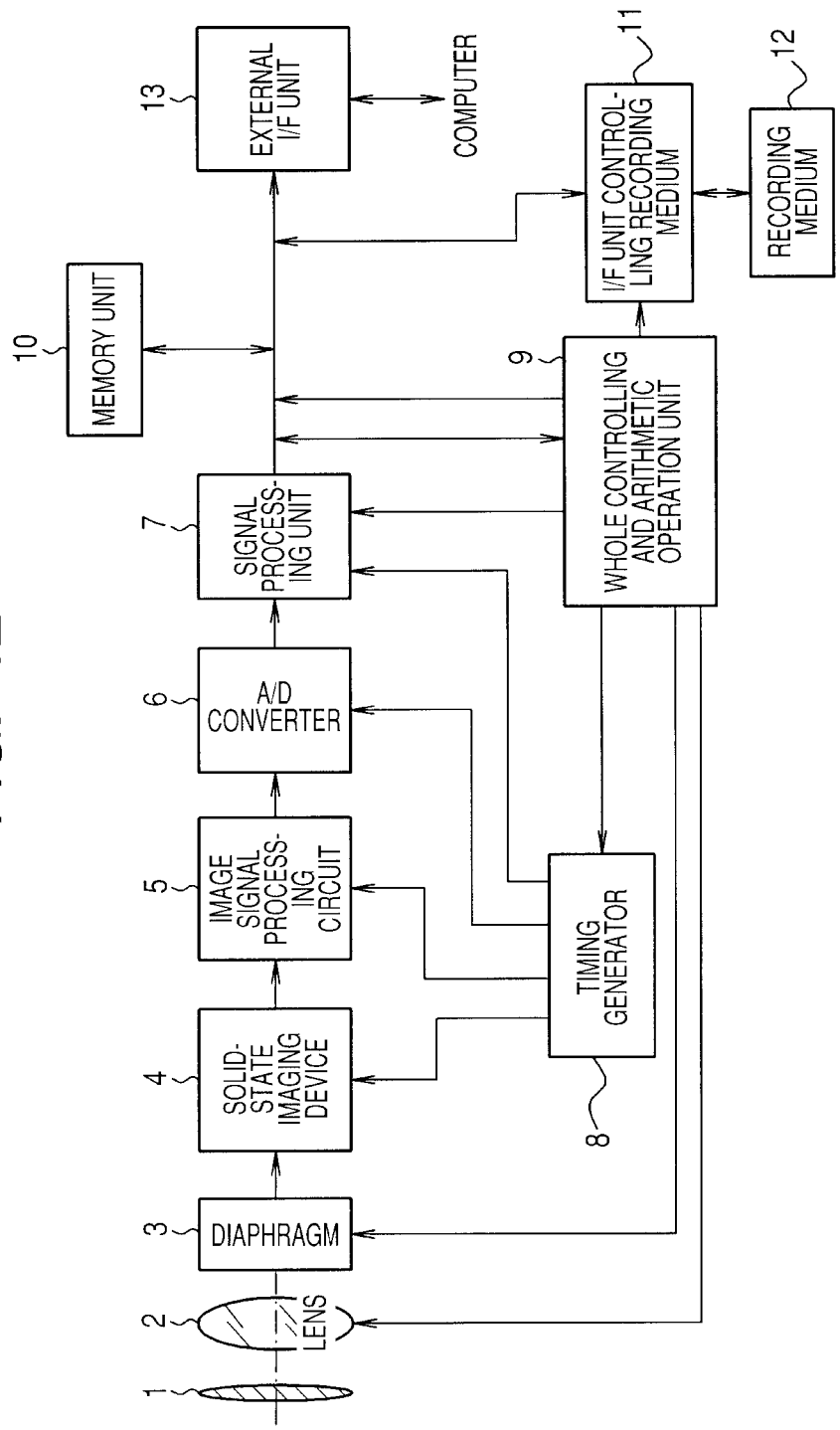
FIG. 12 illustrates a construction example of an imaging system (still video camera) according to a ninth embodiment of the present invention.

FIG. 12 is a diagram illustrating a construction example of an imaging system (still video camera) according to a ninth embodiment of the present invention. The imaging system is a system using the solid-state imaging apparatus of the above described arbitrary embodiment. A construction of the imaging system will be described. A barrier 1 is used for protecting a lens 2 and also as a main switch. The lens 2 images an optical image of a subject to a solid-state imaging device 4. A diaphragm 3 varies an amount of light passing through the lens 2. The solid-state imaging device 4 corresponds to the solid-state imaging apparatus of the first to eighth embodiments, and captures the subject imaged by the lens 2 as an image signal. An image signal processing circuit 5 performs processes such as various corrections and clamping for the image signal output by the solid-state imaging device 4. An A/D converter 6 performs analog-digital conversion of the image signal output by the image signal processing circuit 5. A signal processing unit 7 performs various corrections for image data output by the A/D converter 6, and compresses the data. A timing generator 8 outputs various timing signals to the solid-state imaging device 4, the image signal processing circuit 5, the A/D converter 6 and the signal processing unit 7. It should be noted that respective circuits of the image signal processing circuit 5, the A/D converter 6, the signal processing unit 7 and the timing generator 8 may be formed on the same chip as the solid-state imaging device 4. Moreover, a whole controlling and arithmetic operation unit 9 controls various arithmetic operations and the whole imaging system. A memory unit 10 temporarily stores the image data. An I/F unit controlling recording medium 11 performs recording to or the reading out from a recording medium 12. The recording medium 12 is a removable medium such as a semiconductor memory for recording or reading out the image data. An external interface (I/F) unit 13 communicates with an external computer or the like.

Next, operations in FIG. 12 will be described. When the barrier 1 is opened, a main power supply is turned on. Next, a power supply of a control system is turned on. Furthermore, power supplies of imaging system circuits of the A/D converter 6 and the like are turned on. Then, in order to control an exposure amount, the whole controlling and arithmetic operation unit 9 releases the diaphragm 3, and the signal output by the solid-state imaging device 4 passes through the image signal processing circuit 5 to be output to the A/D converter 6. The A/D converter 6 performs the A/D conversion of the signal, and outputs the A/D converted signal to the signal processing unit 7. Based on the data thereof, the signal processing unit 7 performs an arithmetic operation for an exposure in the whole controlling and arithmetic operation unit 9.

A brightness is determined based on a result of performing this photometry, and depending on a result thereof, the whole controlling and arithmetic operation unit 9 controls the diaphragm 3. Next, based on the signal output by the solid-state imaging device 4, a high-frequency component is extracted, and an arithmetic operation for a distance to the subject is performed in the whole controlling and arithmetic operation unit 9. Subsequently, the lens 2 is driven, and it is determined whether or not the lens 2 is in focus. When it is determined that the lens 2 is out of focus, the lens 2 is driven again to measure the distance.

Then, after it is confirmed that the lens 2 is in focus, a real exposure is started. When the exposure is completed, the image signal output by the solid-state imaging device 4 is corrected in the image signal processing circuit 5, and is further A/D converted in the A/D converter 6. The image signal passes through the signal processing unit 7 to be accumulated in the memory unit 10 by the whole controlling and arithmetic operation unit 9. Subsequently, the data accumulated in the memory unit 10 passes through the I/F unit controlling recording medium 11 to be recorded in the removable recording medium 12 such as the semiconductor memory, under the control of the whole controlling and arithmetic operation unit 9. In addition, the data accumulated in the memory unit 10 may pass through the external I/F unit 13 to be directly input to the computer or the like for image processing.

According to the present embodiment, a high-quality imaging system with low power consumption can be constructed.

According to the first to ninth embodiments, if an image of a high-luminance subject for which a large amount of photo carriers are generated is taken, the FD connecting transistor sets a connecting state to increase the FD capacitor. Thereby, the voltage generated on the FD region can be suppressed. As a result thereof, the saturation of the voltage on and after the vertical signal line 106 can be suppressed, and the dynamic range can be enlarged.

Moreover, in a state where a small amount of photo carriers are generated, the FD connecting transistor sets a non-connecting state to separate the FD region. Thereby, since the FD capacitor is decreased, the voltage generated on the FD region increases, and the good SN ratio can be obtained. Moreover, since a MOS capacitor is not added, the PD area is not compressed and a large PD area can be secured. Therefore, sensitivity and the saturation can be improved, and a high-performance solid-state imaging apparatus can be provided.

In the solid-state imaging apparatus of the first to ninth embodiments, a plurality of photoelectric conversion elements (photodiodes) 101, 401 are arranged in a horizontal direction and a vertical direction, and generate an electric charge by photoelectric conversion. Each of a plurality of transfer transistors 102, 402 is connected to each of the photoelectric conversion elements 101, 401, and transfers the electric charge generated by the plurality of photoelectric conversion elements 101, 401. A plurality of floating diffusion (FD) regions 103, 701 hold the electric charge transferred by the transfer transistors 102, 402. Each of a plurality of amplifiers (SF amplifiers) 104 is connected to each of the floating diffusion regions 103, 701, and amplifies a signal based on the electric charge in the plurality of floating diffusion regions 103, 701. A connecting unit (FD connecting transistor) 109, 702 connects and disconnects between the plurality of floating diffusion regions 103, 701.

Moreover, one of the floating diffusion regions 103, 701 is connected commonly to two or more of the transfer transistors 102, 402. Moreover, two or more of the connecting units 109, 702 are included. Moreover, each of a plurality of selecting transistors 105 is connected to each of the amplifiers 104, and the plurality of selecting transistors 105 select the plurality of amplifiers 104.

Moreover, the photoelectric conversion element 101, 401 has a color filter. Each of the plurality of floating diffusion regions 103, 701 is connected through the transfer transistors 102, 402 to the photoelectric conversion elements 101, 401 having color filters of the same color only.

Moreover, the plurality of floating diffusion regions 103, 701 connected by the connecting unit 109, 702 are connected through the transfer transistors 102, 402 to the photoelectric conversion elements 101, 401 of a number 2N+1 (N is natural number) having color filters of the same color. For example, N is 1 or 2, and one of the three-pixel addition and the five-pixel addition is performed.

Moreover, as illustrated in FIG. 2 and the like, the connecting unit 109, 702 connects the plurality of floating diffusion regions 103, 701 arranged in the vertical direction.

Moreover, as illustrated in FIG. 8, the connecting unit 109 connects the plurality of floating diffusion regions 103 arranged in the horizontal direction.

Moreover, as illustrated in FIG. 9, the connecting unit 109 connects the plurality of floating diffusion regions 103 arranged in the vertical direction and the horizontal direction.

Moreover, the signal based on the electric charge from one pixel is read out by at least two of the amplifiers 104 corresponding to the plurality of floating diffusion regions 103, 701 connected by the connecting unit 109, 702.

Moreover, the connecting unit 109, 702 sets a non-connecting state to amplify by the amplifier 104 in a first mode, and the connecting unit 109, 702 sets a connecting state to amplify by the amplifier 104 in a second mode.

Moreover, the connecting unit 109, 702 sets a connecting state to conduct a low sensitivity reading out, and the connecting unit 109, 702 sets a non-connecting state to conduct a high sensitivity reading out.

Moreover, the electric charges from the plurality of photoelectric conversion elements 101, 401 are added in the plurality of floating diffusion regions 103, 701 connected by the connecting unit 109, 702.

Moreover, a plurality of the connecting units 109, 702 are included, one or more of the plurality of connecting units 109, 702 set the connecting state, and the other of the connecting units 109, 702 set the non-connecting state, to add the electric charges from the plurality of photoelectric conversion elements 101, 401.

Moreover, the plurality of connecting units 109, 702 change the connecting state, to change a number of the photoelectric conversion elements 101, 401 to be subjected to the addition of the electric charges.

Moreover, the electric charge from the photoelectric conversion element 101, 401 is read out not by the amplifier 104 connected to the floating diffusion region 103, 701 connected through the transfer transistor 102, 402, but by the other amplifier 104. In other words, the electric charge from the photoelectric conversion element 101, 401 is read out by the amplifier 104 connected to the floating diffusion region 103, 701 connected through the connecting unit 109, 702.

According to the first to ninth embodiments, if the image of the high-luminance subject is taken, the connecting unit sets the connecting state to increase a capacitor of the floating diffusion region. Thereby, the voltage generated on the floating diffusion region can be suppressed. As a result thereof, the saturation of the output voltage of the amplifier can be suppressed, and the dynamic range can be enlarged.

Moreover, if an image of a low-luminance subject is taken, the connecting unit sets the non-connecting state to separate the floating diffusion region. Thereby, the capacitor of the floating diffusion region is reduced. Thus, the voltage generated on the floating diffusion region increases, and the good SN ratio can be obtained.

It should be noted that all the above described embodiments have only shown examples of embodiments for practicing the present invention, and the technical scope of the present invention must not be construed to be limited thereby. In other words, the present invention can be practiced in various forms without deviating from the technical idea or the main characteristics thereof.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-011344, filed Jan. 21, 2009, which is hereby incorporated by reference herein in its entirety.

What is claimed is:

1. A solid-state imaging apparatus comprising:
a plurality of rows of photoelectric conversion elements for generating electric charges;
a plurality of transfer transistors each connected to each of the photoelectric conversion elements, for transferring the electric charges generated by the plurality of photoelectric conversion elements;
a plurality of floating diffusion regions for holding electric charges transferred by the plurality of transfer transistors;
a plurality of amplifying units each connected to each of the floating diffusion regions, for amplifying a signal based on an electric charge in the plurality of floating diffusion regions;
a plurality of switches for connecting the plurality of floating diffusion regions to each other, each of the plurality of switches being arranged correspondingly to each pair of the rows of the photoelectric conversion elements;
a scanning circuit for scanning each of said plurality of switches, the scanning circuit turning ON each of said plurality of switches by the scanning, in an order of arrangement of the switches, shifting successively from a one switch of a pair of rows of the photoelectric conversion elements to a next one switch of the next pair of rows of photoelectric conversion elements; and
a Bayer array color filter.

2. The solid-state imaging apparatus according to claim 1, wherein a state of ON and OFF of a scanned switch is updated according to horizontal blanking period.

3. The solid-state imaging apparatus according to claim 2, wherein the scanning circuit has a shift register for controlling an operation of the switches and a memory element.

4. The solid-state imaging apparatus according to claim 1, wherein the electric charges transferred to the floating diffusion regions are added by turning a scanned switch ON.

* * * * *